(12) United States Patent
Towner et al.

(10) Patent No.: US 10,492,331 B1
(45) Date of Patent: Nov. 26, 2019

(54) SYSTEM AND METHOD FOR COOLING POWER DISTRIBUTION UNITS

(75) Inventors: Richard C. Towner, Ashburn, VA (US); Robin McCulloch, Mornington (IE); Osvaldo P. Morales, Seattle, WA (US); Jonathan David Hay, Kirkland, WA (US)

(73) Assignee: Amazon Technologies, Inc., Reno, NV (US)

( * ) Notice: Subject to any disclaimer, the term of this patent is extended or adjusted under 35 U.S.C. 154(b) by 1084 days.

(21) Appl. No.: 12/893,813

(22) Filed: Sep. 29, 2010

(51) Int. Cl.
*H05K 7/20* (2006.01)

(52) U.S. Cl.
CPC ...................... *H05K 7/20* (2013.01)

(58) Field of Classification Search
CPC ... H05K 7/20; H05K 7/20745; H05K 7/20009
USPC ................................. 454/184, 284
See application file for complete search history.

(56) References Cited

U.S. PATENT DOCUMENTS

| | | |
|---|---|---|
| 3,481,485 A | 12/1969 | Hess |
| 3,807,572 A | 4/1974 | Luvara et al. |
| 3,834,423 A | 9/1974 | Elson |
| 3,915,477 A | 10/1975 | Timmons |
| 4,082,092 A | 4/1978 | Foster |
| 4,328,897 A | 5/1982 | Weiss |
| 4,448,111 A | 5/1984 | Doherty |
| 4,585,122 A | 4/1986 | Stegenga |
| 4,729,292 A * | 3/1988 | Marton ................. F24F 13/075 454/284 |
| 4,864,469 A | 9/1989 | Boudon |
| 4,926,291 A | 5/1990 | Sarraf |
| 5,207,613 A * | 5/1993 | Ferchau .................... G06F 1/20 361/689 |
| 5,208,722 A | 5/1993 | Ryan et al. |
| 5,216,579 A * | 6/1993 | Basara et al. ............ 361/679.46 |
| 5,237,484 A * | 8/1993 | Ferchau .................... G06F 1/20 165/80.3 |
| 5,294,049 A | 3/1994 | Trunkle et al. |
| 5,398,159 A * | 3/1995 | Andersson et al. .......... 361/695 |

(Continued)

FOREIGN PATENT DOCUMENTS

| | | |
|---|---|---|
| EP | 0 546 211 | 6/1993 |
| EP | 0 741 269 | 11/1996 |

(Continued)

OTHER PUBLICATIONS

U.S. Appl. No. 11/535,180.

(Continued)

*Primary Examiner* — Steven B McAllister
*Assistant Examiner* — Samantha A Probst
(74) *Attorney, Agent, or Firm* — Robert C. Kowert; Meyertons, Hood, Kivlin, Kowert & Goetzel, P.C.

(57) ABSTRACT

A system for cooling a power distribution unit in a room of a data center includes an air handling system that supplies air to the room or removes air from the room through an opening in the room and an air directing device. The first end of the air directing device couples at the opening in the room. The second end of the air directing device couples with the power distribution unit at one or more openings of an enclosure of the power distribution unit. The air directing device directs air between the opening in the room and the one or more openings of the power distribution unit.

27 Claims, 6 Drawing Sheets

(56) References Cited

U.S. PATENT DOCUMENTS

| | | | |
|---|---|---|---|
| 5,412,534 A | 5/1995 | Cutts et al. | |
| 5,467,609 A * | 11/1995 | Feeney | 62/259.2 |
| 5,473,507 A | 12/1995 | Schwegler et al. | |
| 5,506,750 A | 4/1996 | Carteau et al. | |
| 5,518,277 A | 5/1996 | Sanders | |
| 5,621,890 A | 4/1997 | Notarianni et al. | |
| 5,644,472 A | 7/1997 | Klein | |
| 5,682,289 A | 10/1997 | Schwegler et al. | |
| 5,751,549 A | 5/1998 | Eberhardt et al. | |
| 5,772,500 A | 6/1998 | Harvey et al. | |
| 5,796,580 A | 8/1998 | Komatsu et al. | |
| 5,806,438 A | 9/1998 | Beaudet | |
| 5,822,184 A | 10/1998 | Rabinovitz | |
| 5,843,131 A | 12/1998 | McDonough | |
| 5,871,396 A | 2/1999 | Shen | |
| 6,031,717 A | 2/2000 | Baddour et al. | |
| 6,039,190 A | 3/2000 | Clausen | |
| 6,141,986 A | 11/2000 | Koplin | |
| 6,155,747 A * | 12/2000 | Payne | B09B 3/00 |
| | | | 405/129.55 |
| 6,166,917 A | 12/2000 | Anderson | |
| 6,259,605 B1 | 7/2001 | Schmitt | |
| 6,364,009 B1 | 4/2002 | Macmanus et al. | |
| 6,365,830 B1 * | 4/2002 | Snider, Jr. | H02G 3/0456 |
| | | | 174/484 |
| 6,425,417 B1 | 7/2002 | Paschke | |
| 6,456,498 B1 | 9/2002 | Larson et al. | |
| 6,459,579 B1 | 10/2002 | Farmer et al. | |
| 6,469,899 B2 | 10/2002 | Hastings et al. | |
| 6,496,366 B1 | 12/2002 | Coglitore et al. | |
| 6,499,609 B2 | 12/2002 | Patriche et al. | |
| 6,525,936 B2 | 2/2003 | Beitelmal et al. | |
| 6,563,704 B2 | 5/2003 | Grouell et al. | |
| 6,590,768 B1 | 7/2003 | Wiley | |
| 6,603,661 B2 | 8/2003 | Smith et al. | |
| 6,621,693 B1 | 9/2003 | Potter et al. | |
| 6,625,020 B1 | 9/2003 | Hanson et al. | |
| 6,650,535 B1 | 11/2003 | Moss et al. | |
| 6,694,759 B1 * | 2/2004 | Bash | G05D 16/202 |
| | | | 236/49.3 |
| 6,754,082 B1 | 6/2004 | Ding et al. | |
| 6,767,280 B1 | 7/2004 | Berger | |
| 6,791,836 B2 | 9/2004 | Cipolla et al. | |
| 6,795,314 B1 | 9/2004 | Arbogast et al. | |
| 6,804,123 B1 | 10/2004 | Cheng | |
| 6,819,567 B2 | 11/2004 | Baker et al. | |
| 6,833,995 B1 | 12/2004 | Hsue et al. | |
| 6,859,366 B2 | 2/2005 | Fink et al. | |
| 6,862,179 B2 * | 3/2005 | Beitelmal | F25D 17/06 |
| | | | 361/679.53 |
| 6,957,544 B2 * | 10/2005 | Dobbs | H05K 7/20745 |
| | | | 62/178 |
| 6,960,130 B2 | 11/2005 | Gebke et al. | |
| 7,003,966 B2 | 2/2006 | Sharma et al. | |
| 7,010,392 B2 | 3/2006 | Bash et al. | |
| 7,031,154 B2 | 4/2006 | Bash et al. | |
| 7,033,267 B2 * | 4/2006 | Rasmussen | 454/184 |
| 7,035,111 B1 | 4/2006 | Lin et al. | |
| 7,042,722 B2 | 5/2006 | Suzuki et al. | |
| 7,068,505 B2 | 6/2006 | Kosugi | |
| 7,112,131 B2 | 9/2006 | Rasmussen et al. | |
| 7,170,745 B2 * | 1/2007 | Bash et al. | 361/695 |
| 7,197,433 B2 | 3/2007 | Patel et al. | |
| 7,232,369 B2 * | 6/2007 | Karidis | F24F 7/10 |
| | | | 454/274 |
| 7,238,104 B1 | 7/2007 | Greenslade et al. | |
| 7,257,956 B2 | 8/2007 | Shimada et al. | |
| 7,266,964 B2 * | 9/2007 | Vogel et al. | 62/259.2 |
| 7,272,001 B2 | 9/2007 | Cheng | |
| 7,278,273 B1 | 10/2007 | Whitted et al. | |
| 7,283,358 B2 | 10/2007 | Campbell et al. | |
| 7,295,444 B1 * | 11/2007 | Wang | H05K 7/20736 |
| | | | 361/688 |
| 7,346,913 B2 | 3/2008 | Ishimine et al. | |
| 7,361,081 B2 | 4/2008 | Beitelmal et al. | |
| 7,379,299 B2 | 5/2008 | Walsh et al. | |
| 7,403,385 B2 | 7/2008 | Boone et al. | |
| 7,408,775 B2 | 8/2008 | Walz et al. | |
| 7,434,413 B2 | 10/2008 | Wruck | |
| 7,486,505 B2 | 2/2009 | Fushimi et al. | |
| 7,486,511 B1 * | 2/2009 | Griffel | H05K 7/20745 |
| | | | 361/679.46 |
| 7,499,286 B2 | 3/2009 | Berke et al. | |
| 7,500,911 B2 | 3/2009 | Johnson et al. | |
| 7,542,288 B2 | 6/2009 | Lanus | |
| 7,643,291 B2 * | 1/2010 | Mallia | F24F 11/053 |
| | | | 165/104.33 |
| 7,646,590 B1 * | 1/2010 | Corhodzic | H05K 7/1492 |
| | | | 361/622 |
| 7,656,660 B2 * | 2/2010 | Hoeft | H05K 7/20745 |
| | | | 181/200 |
| 7,660,116 B2 | 2/2010 | Claassen et al. | |
| 7,660,117 B2 | 2/2010 | Werner et al. | |
| 7,675,750 B1 * | 3/2010 | Tamarkin | H05K 7/20736 |
| | | | 165/104.33 |
| 7,701,710 B2 | 4/2010 | Tanaka et al. | |
| 7,733,666 B2 | 6/2010 | Ichihara et al. | |
| 7,746,634 B2 | 6/2010 | Hom et al. | |
| 7,764,498 B2 | 7/2010 | Conn | |
| 7,768,780 B2 | 8/2010 | Coglitore et al. | |
| 7,768,787 B2 | 8/2010 | Vaughan et al. | |
| 7,804,685 B2 | 9/2010 | Krietzman | |
| 7,821,790 B2 | 10/2010 | Sharma et al. | |
| 7,843,685 B2 | 11/2010 | Beauchamp et al. | |
| 7,869,210 B2 | 1/2011 | Moss | |
| 7,878,888 B2 | 2/2011 | Rasmussen et al. | |
| 7,885,795 B2 * | 2/2011 | Rasmussen | G06F 1/20 |
| | | | 361/688 |
| 7,929,300 B1 | 4/2011 | Bisbikis et al. | |
| 7,944,700 B2 | 5/2011 | Wang et al. | |
| 7,990,700 B2 | 8/2011 | Guo | |
| 8,054,625 B2 * | 11/2011 | Noteboom | H05K 7/20736 |
| | | | 361/688 |
| 8,087,979 B2 | 1/2012 | Rasmussen | |
| 8,127,562 B2 * | 3/2012 | Gilder | H05K 7/20745 |
| | | | 62/259.1 |
| 8,154,870 B1 | 4/2012 | Czamara et al. | |
| 8,238,104 B2 * | 8/2012 | Salpeter | 361/716 |
| 8,300,410 B2 * | 10/2012 | Slessman | H05K 7/20745 |
| | | | 165/104.33 |
| 8,411,439 B1 * | 4/2013 | Carlson | H05K 7/20827 |
| | | | 165/104.33 |
| 8,425,287 B2 * | 4/2013 | Wexler | H05K 7/20745 |
| | | | 361/690 |
| 8,446,710 B2 * | 5/2013 | Schmitt | H05K 7/1492 |
| | | | 174/480 |
| 8,477,491 B1 * | 7/2013 | Ross et al. | 361/679.5 |
| 8,812,275 B2 * | 8/2014 | Archibald | H05K 7/20745 |
| | | | 703/1 |
| 9,052,722 B2 * | 6/2015 | Chainer et al. | |
| 9,110,476 B2 | 8/2015 | David et al. | |
| 9,152,191 B1 * | 10/2015 | Gardner | |
| 9,195,243 B2 * | 11/2015 | Chang | |
| 9,195,282 B2 * | 11/2015 | Shelnutt et al. | |
| 9,198,310 B2 * | 11/2015 | Eichelberg et al. | |
| 9,395,974 B1 * | 7/2016 | Eichelberg | G06F 8/65 |
| 9,871,406 B1 * | 1/2018 | Churnock | H02J 9/061 |
| 9,894,809 B1 * | 2/2018 | Springs | H05K 7/20745 |
| 2001/0029163 A1 | 10/2001 | Spinazzola et al. | |
| 2001/0035684 A1 * | 11/2001 | Yamane | 307/10.1 |
| 2002/0021557 A1 | 2/2002 | Ishimine et al. | |
| 2002/0100736 A1 | 8/2002 | Lopez | |
| 2002/0134531 A1 | 9/2002 | Yanagida | |
| 2002/0181194 A1 | 12/2002 | Ho et al. | |
| 2003/0156385 A1 | 8/2003 | Askeland et al. | |
| 2004/0020224 A1 | 2/2004 | Bash et al. | |
| 2004/0032722 A1 | 2/2004 | Wrycraft et al. | |
| 2004/0165349 A1 | 8/2004 | Arbogast et al. | |
| 2004/0218355 A1 | 11/2004 | Bash et al. | |
| 2004/0223300 A1 * | 11/2004 | Fink | H05K 7/20 |
| | | | 361/690 |

(56) References Cited

U.S. PATENT DOCUMENTS

| | | | |
|---|---|---|---|
| 2004/0257766 A1* | 12/2004 | Rasmussen | H05K 7/20572 361/689 |
| 2005/0135069 A1 | 6/2005 | King et al. | |
| 2005/0166860 A1 | 8/2005 | Austin et al. | |
| 2005/0188689 A1 | 9/2005 | Juby et al. | |
| 2005/0228618 A1 | 10/2005 | Patel et al. | |
| 2005/0237716 A1 | 10/2005 | Chu et al. | |
| 2005/0257232 A1 | 11/2005 | Hidaka | |
| 2005/0265004 A1 | 12/2005 | Coglitore et al. | |
| 2005/0281014 A1 | 12/2005 | Carullo et al. | |
| 2006/0059937 A1 | 3/2006 | Perkins et al. | |
| 2006/0061955 A1 | 3/2006 | Imblum | |
| 2006/0191925 A1* | 8/2006 | Iwamoto | A47B 77/08 219/757 |
| 2006/0199508 A1* | 9/2006 | Nair et al. | 454/237 |
| 2006/0232945 A1* | 10/2006 | Chu et al. | 361/724 |
| 2006/0250766 A1 | 11/2006 | Blaalid et al. | |
| 2006/0250770 A1* | 11/2006 | Campbell et al. | 361/695 |
| 2006/0274496 A1 | 12/2006 | Lee et al. | |
| 2006/0290245 A1 | 12/2006 | Hidaka | |
| 2007/0019380 A1* | 1/2007 | Campbell et al. | 361/687 |
| 2007/0053169 A1 | 3/2007 | Carlson et al. | |
| 2007/0058336 A1 | 3/2007 | Cheng | |
| 2007/0074525 A1 | 4/2007 | Vinson et al. | |
| 2007/0076369 A1 | 4/2007 | Chen et al. | |
| 2007/0101746 A1 | 5/2007 | Scholm et al. | |
| 2007/0159790 A1 | 7/2007 | Coglitore et al. | |
| 2007/0173189 A1* | 7/2007 | Lewis | 454/184 |
| 2007/0213000 A1 | 9/2007 | Day | |
| 2007/0217172 A1 | 9/2007 | Bisbikis et al. | |
| 2007/0223200 A1 | 9/2007 | Fujiya et al. | |
| 2007/0227710 A1* | 10/2007 | Belady et al. | 165/122 |
| 2007/0240433 A1 | 10/2007 | Manole | |
| 2008/0013275 A1 | 1/2008 | Beckley et al. | |
| 2008/0029250 A1 | 2/2008 | Carlson et al. | |
| 2008/0037209 A1 | 2/2008 | Niazi et al. | |
| 2008/0043427 A1 | 2/2008 | Lee et al. | |
| 2008/0055846 A1 | 3/2008 | Clidaras et al. | |
| 2008/0094797 A1 | 4/2008 | Coglitore et al. | |
| 2008/0112127 A1 | 5/2008 | June et al. | |
| 2008/0112133 A1* | 5/2008 | Torudbakken et al. | 361/694 |
| 2008/0158813 A1 | 7/2008 | Yin | |
| 2008/0191590 A1 | 8/2008 | Lin et al. | |
| 2008/0232064 A1 | 9/2008 | Sato et al. | |
| 2008/0259566 A1 | 10/2008 | Fried | |
| 2008/0285232 A1* | 11/2008 | Claassen | H05K 7/20736 361/694 |
| 2008/0305733 A1 | 12/2008 | Noteboom et al. | |
| 2009/0031148 A1* | 1/2009 | Densham | G06F 1/189 713/300 |
| 2009/0061755 A1 | 3/2009 | Calder et al. | |
| 2009/0086441 A1 | 4/2009 | Randall et al. | |
| 2009/0097200 A1 | 4/2009 | Sharma et al. | |
| 2009/0109609 A1 | 4/2009 | Lai et al. | |
| 2009/0122505 A1 | 5/2009 | Lu | |
| 2009/0156114 A1* | 6/2009 | Ahladas | H05K 7/20745 454/184 |
| 2009/0168345 A1* | 7/2009 | Martini | F24F 11/0001 361/691 |
| 2009/0173017 A1* | 7/2009 | Hall | H05K 7/20745 52/69 |
| 2009/0237877 A1 | 9/2009 | Honda et al. | |
| 2009/0257187 A1 | 10/2009 | Mills et al. | |
| 2009/0260384 A1 | 10/2009 | Champion et al. | |
| 2009/0293518 A1* | 12/2009 | Bettella | F04D 25/12 62/186 |
| 2009/0296322 A1 | 12/2009 | Yang et al. | |
| 2009/0309570 A1* | 12/2009 | Lehmann | G06F 1/26 323/318 |
| 2009/0319650 A1* | 12/2009 | Collins | G06F 1/206 709/223 |
| 2009/0321105 A1 | 12/2009 | Sawyer | |
| 2009/0326879 A1* | 12/2009 | Hamann | G06F 1/206 703/2 |
| 2010/0024445 A1 | 2/2010 | Cichanowicz | |
| 2010/0027216 A1* | 2/2010 | Matsushima | H05K 7/20745 361/679.49 |
| 2010/0091458 A1 | 4/2010 | Mosier et al. | |
| 2010/0118488 A1* | 5/2010 | Hoffman | H05K 7/20909 361/691 |
| 2010/0149754 A1 | 6/2010 | Chapel et al. | |
| 2010/0271766 A1 | 10/2010 | Lin | |
| 2010/0290604 A1* | 11/2010 | Wright | H05K 7/20945 379/102.04 |
| 2011/0063778 A1* | 3/2011 | Brouillard | H05K 7/20645 361/678 |
| 2011/0149508 A1 | 6/2011 | Malekmadani | |
| 2011/0205705 A1* | 8/2011 | Graybill | H05K 7/20745 361/696 |
| 2011/0284422 A1 | 11/2011 | Yamada | |
| 2011/0307102 A1* | 12/2011 | Czamara | H05K 7/1497 700/277 |
| 2012/0033377 A1* | 2/2012 | Salpeter | H05K 7/1488 361/679.53 |
| 2012/0035781 A1* | 2/2012 | Archibald | H05K 7/20745 700/300 |
| 2012/0092811 A1 | 4/2012 | Chapel et al. | |
| 2013/0194772 A1* | 8/2013 | Rojo | H04Q 1/112 361/818 |

FOREIGN PATENT DOCUMENTS

| | | |
|---|---|---|
| EP | 0741269 | 11/1996 |
| EP | 2 053 911 | 4/2009 |
| EP | 2053911 | 4/2009 |
| EP | 2202751 | 6/2010 |
| JP | 2010-86450 | 4/2010 |
| WO | 98/34450 | 8/1998 |
| WO | 9834450 | 8/1998 |
| WO | 2008/143503 | 11/2008 |
| WO | 2008143503 | 11/2008 |

OTHER PUBLICATIONS

U.S. Appl. No. 12/341,137, filed Dec. 28, 2008.
U.S. Appl. No. 11/956,849, filed Dec. 14, 2007.
U.S. Appl. No. 12/163,146, filed Jun. 27, 2008.
U.S. Appl. No. 12/646,417, filed Dec. 23, 2009.
U.S. Appl. No. 12/751,209, filed Mar. 31, 2010.
U.S. Appl. No. 12/751,212, filed Mar. 31, 2010.
U.S. Appl. No. 12/751,206, filed Mar. 31, 2010, Michael W. Schrempp.
U.S. Appl. No. 12/751,209, filed Mar. 31, 2010, Michael P. Czamara.
U.S. Appl. No. 12/751,212, filed Mar. 31, 2010, Michael P. Czamara.
U.S. Appl. No. 12/886,469, filed Sep. 20, 2010, Peter G. Ross.
U.S. Appl. No. 12/886,440, filed Sep. 20, 2010, Peter G Ross et al.
U.S. Appl. No. 12/886,472, filed Sep. 20, 2010, Peter G. Ross.
U.S. Appl. No. 12/893,813, filed Sep. 29, 2010, Richard C. Towner.
U.S. Appl. No. 13/103,860, filed May 9, 2011, Michael P. Czamara.
U.S. Appl. No. 12/886,437, filed Sep. 20, 2010, Peter G. Ross.
U.S. Appl. No. 12/163,146, filed Jun. 27, 2008, Osvaldo P. Morales.

\* cited by examiner

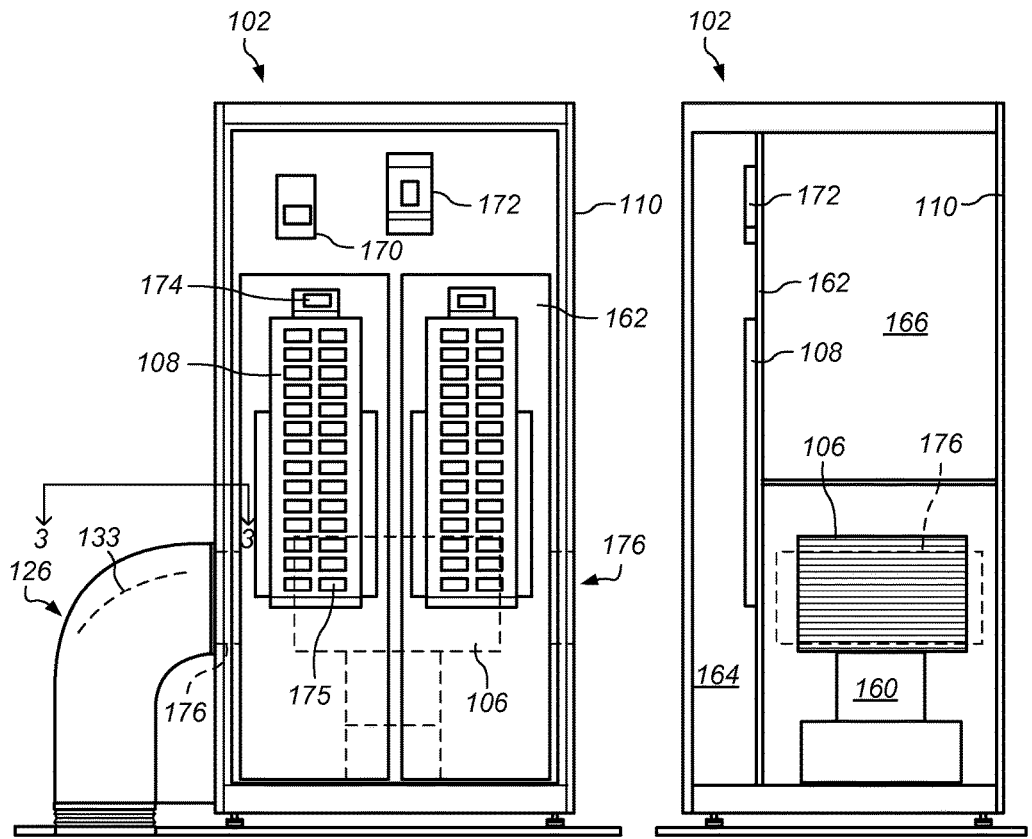
*FIG. 2A*  *FIG. 2B*
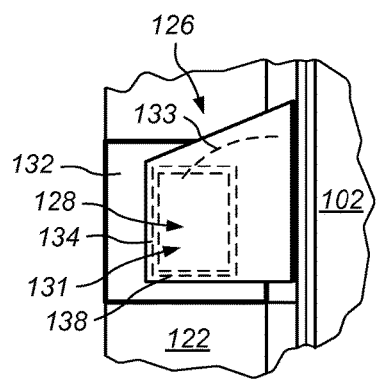
*FIG. 3*

SYSTEM AND METHOD FOR COOLING POWER DISTRIBUTION UNITS

BACKGROUND

Organizations such as on-line retailers, Internet service providers, search providers, financial institutions, universities, and other computing-intensive organizations often conduct computer operations from large scale computing facilities. Such computing facilities house and accommodate a large amount of server, network, and computer equipment to process, store, and exchange data as needed to carried out an organization's operations. Typically, a computer room of a computing facility includes many server racks. Each server rack, in turn, includes many servers and associated computer equipment.

Because the computer room of a computing facility may contain a large number of servers, a large amount of electrical power may be required to operate the facility. In addition, the electrical power is distributed to a large number of locations spread throughout the computer room (e.g., many racks spaced from one another, and many servers in each rack). Usually, a facility receives a power feed at a relatively high voltage. This power feed is stepped down to a lower voltage (e.g., 110V). A network of cabling, bus bars, power connectors, and power distribution units ("PDUs"), is used to deliver the power at the lower voltage to numerous specific components in the facility.

A typical PDU for a data center includes a large transformer and one or more distribution panels in common enclosure, such as a cabinet. The transformer steps down voltage levels for electrical power to be distributed to numerous loads in the data center (such as rack-mounted servers) that receive power from the PDU. Each breaker in the distribution panels may provide protection for a separate set of power lines to the numerous loads. The transformer may generate a substantial amount of heat. If the transformer heats the air temperature in the enclosure beyond acceptable limits, the temperature of one or more of the breakers may exceed the mechanical design limits of the breakers, and the breakers may trip due to a thermal overload condition.

BRIEF DESCRIPTION OF THE DRAWINGS

FIG. 2A illustrates a schematic front view of a power distribution unit coupled to an air directing device according to one embodiment. FIG. 2B illustrates a schematic side view of the power distribution unit illustrated in FIG. 2A.

FIG. 3 is a top view illustrating one embodiment of an air directing device installed in an opening created by removal of a tile in a raised floor.

Figure 1:
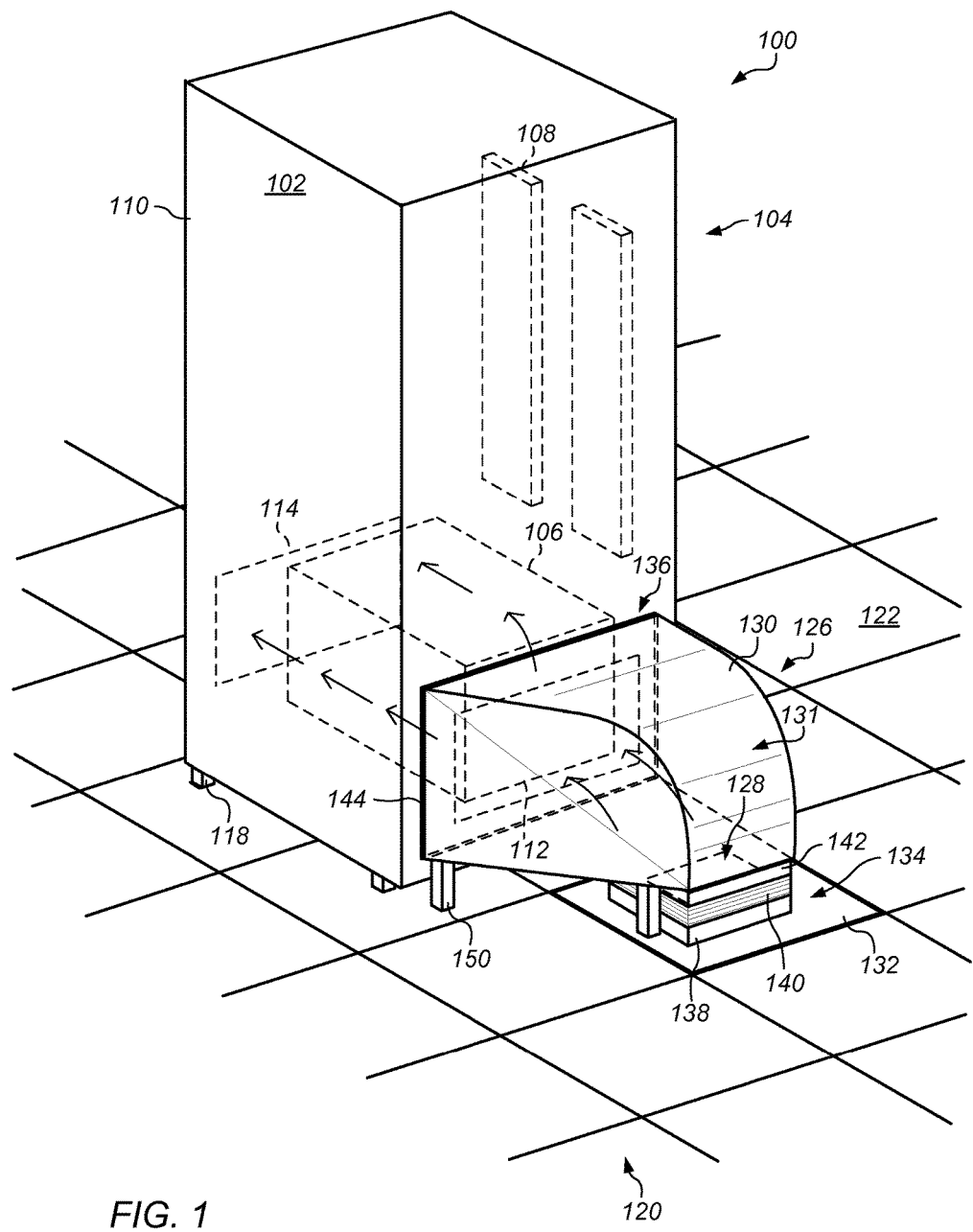
FIG. 1 illustrates a portion of a data center including an air directing device for a power distribution unit according to one embodiment.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims. The headings used herein are for organizational purposes only and are not meant to be used to limit the scope of the description or the claims. As used throughout this application, the word "may" is used in a permissive sense (i.e., meaning having the potential to), rather than the mandatory sense (i.e., meaning must). Similarly, the words "include," "including," and "includes" mean including, but not limited to.

DETAILED DESCRIPTION OF EMBODIMENTS

Various embodiments of air directing devices, and systems and methods for cooling power distribution units, are disclosed. According to one embodiment, a system for cooling a power distribution unit in a room of a data center includes an air handling system that supplies air to the room or removes air from the room through an opening in the room (such as an opening in a raised floor) and an air directing device. The first end of the air directing device couples at the opening in the room. The second end of the air directing device couples with the power distribution unit at one or more openings of an enclosure of the power distribution unit (such as vents or perforations in a a cabinet of the power distribution). The air directing device directs air between the opening in the room and the one or more openings of the power distribution unit.

According to one embodiment, a data center includes one or more power distribution units in a room of the data center, one or more air handling systems that supply or remove air through one or more openings in the room, and one or more air directing devices. At least one of the power distribution units includes an enclosure. At least one of the air directing devices includes a first end that couples with at least one of the openings in the room and a second end that couples with at least one of the power distribution units at one or more openings of the enclosure of the at least one power distribution unit. The air directing device directs air between the opening in the room and the one or more openings in the enclosure of the power distribution unit.

According to one embodiment, a method of cooling a power distribution unit includes creating the opening in the room of the data center; and ducting air between the opening in the room and the power distribution unit. In some embodiments, the opening is created by removing a tile from a raised floor above a sub-floor chamber.

As used herein, "power distribution unit" means any device, module, component, or combination thereof, that can be used to distribute electrical power. The elements of a power distribution unit may be embodied within a single component or assembly (such as a transformer and a rack power distribution unit housed in a common enclosure), or may be distributed among two or more components or assemblies (such as a transformer and a rack power distribution unit each housed in separate enclosure, and associated cables, etc.). A power distribution unit may include a transformer, power monitoring, fault detection, isolation.

As used herein, "floor power distribution unit" refers to a power distribution unit that can distribute electrical power to various components in a computer room. In certain embodiments, a power distribution unit includes a k-rated transformer. A power distribution unit may be housed in an enclosure, such as a cabinet.

As used herein, "air handling system" means a system that provides or moves air to, or removes air from, one or more systems or components.

As used herein, an "aisle" means a space next to one or more racks.

As used herein, "ambient" means, with respect to a system or facility, the air surrounding at least a portion of the system or facility. For example, with respect to a data center, ambient air may be air outside the data center, for example, at or near an intake hood of an air handling system for the data center. As another example, for a cabinet-mounted system, ambient air may be the room air outside the cabinet.

As used herein, "computing" includes any operations that can be performed by a computer, such as computation, data storage, data retrieval, or communications.

As used herein, "computer system" includes any of various computer systems or components thereof. One example of a computer system is a rack-mounted server. As used herein, the term computer is not limited to just those integrated circuits referred to in the art as a computer, but broadly refers to a processor, a server, a microcontroller, a microcomputer, a programmable logic controller (PLC), an application specific integrated circuit, and other programmable e circuits, and these terms are used interchangeably herein. In the various embodiments, memory may include, but is not limited to, a computer-readable medium, such as a random access memory (RAM). Alternatively, a compact disc-read only memory (CD-ROM), a magneto-optical disk (MOD), and/or a digital versatile disc (DVD) may also be used. Also, additional input channels may include computer peripherals associated with an operator interface such as a mouse and a keyboard. Alternatively, other computer peripherals may also be used that may include, for example, a scanner. Furthermore, in the some embodiments, additional output channels may include an operator interface monitor and/or a printer.

As used herein, a "damper" includes any device or component that can be moved to control (e.g., increase or decrease) the flow of fluid through a duct or other passageway. Examples of dampers include plates, blades, panels, or discs, or any combination thereof. A damper may include multiple elements. For example, a damper may include a series of plates in parallel relation to one another that can be simultaneously rotated to close a duct. As used herein, to "position" a damper means to place or leave one or more elements of the damper to achieve desired flow characteristics through the damper, such as open, closed, or partially open.

As used herein, "data center" includes any facility or portion of a facility in which computer operations are carried out. A data center may include servers dedicated to specific functions or serving multiple functions. Examples of computer operations include information processing, communications, testing, simulations, power distribution and control, and operational control.

As used herein, a "duct" includes any device, apparatus, element, or portion thereof, that can direct, segregate, or channel a fluid, such as air. Examples of ducts include cloth or fabric ducts, sheet metal ducts, molded ducts, tubes, or pipes. The cross sectional shape of a passageway of a duct may be square, rectangular, round or irregular, and may be uniform or change over the length of the duct. A duct may be a separately produced component or integral with one or more other components, such as a frame.

As used herein, "plenum" means a chamber that can be used to distribute air.

As used herein, a "rack" means a rack, container, frame, or other element or combination of elements that can contain or physically support one or more computer systems.

As used herein, "room" means a room or a space of a building. As used herein, "computer room" means a room of a building in which computer systems, such as rack-mounted servers, are operated.

As used herein, a "space" means a space, area or volume.

FIG. 1 illustrates a portion of a data center including an air directing device for a power distribution unit according to one embodiment. Data center 100 includes power distribution unit 102 in room 104. Power distribution unit 102 may supply power to computer systems in data center 100 (the computer systems and connecting power cables are omitted for clarity). Power distribution unit 102 includes transformer 106 and distribution panels 108 in cabinet 110. Cabinet 110 includes vent 112 and vent 114. Vent 112 and vent 114 may be on opposing sides of power distribution unit 102. Vent 112 and vent 114 may be at approximately the same height as all or part of transformer 106.

Power distribution unit 102 includes legs 118. Power distribution unit 102 may rest on floor 120 of room 104. Legs 118 may support cabinet 110 above the floor 120 (for example, one to two inches above the floor). Floor 120 includes tiles 122. In some embodiments, floor 120 is a raised floor. For example, floor 120 may be raised above a sub-floor to create an air chamber to supply air under pressure to room 104.

Data center 100 includes air directing device 126. Air directing device 126 may direct air into or draw air out of power distribution unit 102 through vent 112 in cabinet 110. Air flowing to or from an air directing device 114 through cabinet 110 may provide cooling for transformer 106 and/or other components in power distribution unit 102. In one embodiment, air for cooling power distribution unit 102 is supplied from a sub-floor plenum through opening 128 in floor 120. Air directing device includes duct 130. Duct 130 includes passage 131. Passage 131 may channel and/or direct air between vent 112 in power distribution unit 102 and opening 128 in floor 120.

In some embodiments, access to a sub-floor chamber is achieved by removing a tile from the floor of a room of a data center. In the embodiment illustrated in FIG. 1, for example, one of tiles 122 has been removed from floor 102 to create opening 128. Removal of the tile may establish a path for fluid communication between air in room 102 and air below floor 120. Adapter plate 132 is provided in opening 128 in floor 102.

Air directing device 126 includes floor coupling portion 134 and PDU coupling portion 136. Floor coupling portion 134 includes base member 138, flexible member 140, and transition member 142. PDU coupling portion 136 includes gasket 144.

Base member 138 of floor coupling portion 134 may couple with adapter plate 132. Adapter plate 132 may include an opening that corresponds to the size and shape of base member 138. In certain embodiments, base member 134 may be press fit into adapter plate 132. In certain embodiments, adapter plate 132 and/or base member may include resilient mating portions to facilitate a seal between base member 138 and adapter plate 132. Flexible member 140 may allow base member 138 allow base member 138 to float relative to duct 130 to facilitate a connection between air directing device 126 and floor 120.

In certain embodiments, floor coupling portion 134 is secured to floor 120. Floor coupling portion 134 may be secured in a manner, such as with screws, hooks, clips, hook-and-loop fasteners, or other fasteners.

In the embodiment illustrated in FIG. 1, adapter plate 132 fills the gap between base member 138 and the edges of adjoining tiles 122. In other embodiments, however, the base member of a coupling portion may have a size and form that matches or covers an opening in the floor without any adapter plate. In certain embodiments, a floor coupling portion includes a seal that resiliently engages the floor.

Air directing device 126 includes support legs 150. Support legs 150 may support duct 130 on floor 120. In some embodiments, air directing device 126 is freestanding on floor 120, without, for example, any reliance on support by a power distribution unit 102 or other structures in the room. Thus, in some embodiments, power distribution unit 102 may be translated (rolled or slid, for example) into a position next to air directing device 126 while air directing device 126 remains in a fixed position on floor. Gasket 144 may form a seal between power distribution unit 102 and air directing device 126 when power distribution unit 102 is placed in position on floor 120. In certain embodiments, PDU coupling portion 136 is secured to power distribution unit 102, such as with screws, hooks, clips, hook-and-loop fasteners, or other fasteners.

Air directing device 126, and portion thereof, may be made of any material. Suitable materials for an air directing device may include, for example, metal (such as sheet metal), polymer, or fabric. In one embodiment, a duct for an air directing device is 6061 aluminum alloy. In some embodiments, a duct is produced as a single part, such as by molding, forming, or machining. In other embodiments, a duct is an assembly of two or more parts, such as aluminum sheets. In certain embodiments, a duct includes thermal insulation.

In some embodiments, all or part of a floor coupling portion or a PDU coupling portion for an air directing device are electrically non-conductive. For example, flexible member 140 may be a non-conductive elastomer. A non-conductive coupling portion in an air directing device may electrically isolate a power distribution unit from the floor of a room.

In various embodiments, the cross section of an air directing device may have any shape cross section, such as round, oval, square, or irregular. In some embodiments, a passage of an air directing device has a cross section that increases over at least a portion of its length. For example, as illustrated in FIG. 1, duct 130 may taper such that the cross section of duct 130 increases in the direction of power distribution unit 102.

FIG. 2A illustrates a schematic front view of a power distribution unit coupled to an air directing device according to one embodiment. FIG. 2B illustrates a schematic side view of the power distribution unit illustrated in FIG. 2A.

Power distribution unit 102 includes transformer 106, distribution panels 108, and cabinet 110. Transformer 106 is mounted on support 160.

Cabinet 110 includes front panel 162. Cabinet 110 may include cabinet doors (omitted from FIGS. 2A and 2B for clarity). Front panel 162 may divide the interior space in cabinet 110 into front space 164 and rear space 166. Distribution panels 108, interface panel 170, main input breaker 172, and panel main breakers 174 are mounted in front panel 162. Distribution panels 108 include circuit breakers 175. Each of circuit breakers 175 may provide overload protection for a different output from power distribution unit 102.

Transformer 106 may receive input power via input power cables (omitted from FIGS. 2A and 2B for clarity) and step down the voltages to output power. The output power may be distributed through distribution panels 108 (cables for the output lines are omitted from FIGS. 2A and 2B for clarity). In one embodiment, transformer receives three-phase power at 480 volts and provides output power to distribution panels 108 at phase-to-neutral voltages of about 208 volts.

Cabinet 110 includes vents 176. Vents 176 may be on opposing sides of cabinet 110. Vents 176 may allow air to be introduced or removed from the interior space of cabinet 110. Air directing devices may be coupled to one or more of vents 176.

Although in FIG. 2B, vents 176 are shown as a single rectangular opening for illustrative purposes, vents 176 may have any shape and any number of openings. For example, each vent 176 may be a series of horizontal slots or louvers. In another embodiment, vents 176 may be any number of perforations in a panel. In some embodiments, vents 176 may be provided in an off-the-shelf configuration of a power distribution unit.

Although in FIG. 2B, vents 176 are located on the sides of cabinet 110 and flank transformer 106, vents may be provided in any location of enclosure 110. For example, vents may in various embodiments be provided in the upper portion of the sides of cabinet 176 and/or on the front, back, top, or bottom of cabinet 110. An air directing device may couple with all of the openings in a panel or only a portion of the openings. For example, in a power distribution unit including perforations over the full height of a side panel, an air directing device may couple with only the perforations in the lower portion of the side panel.

FIG. 3 is a top view illustrating one embodiment of an air directing device installed in an opening created by removal of a tile in a raised floor. Adapter plate 132 sits in opening 128. In one embodiment, the adapter plate fits into a 2 foot by 2 foot square opening created by the removal of one tile. Base member 138 of floor coupling portion 134 may be in any position relative to the edges of floor opening 128. For example, base member 134 may be centered in opening 128, or may abut a corner of opening 128. In certain embodiments, a duct for an air directing device is flexible to accommodate different positioning of a power distribution unit relative to a floor opening.

In some embodiments, an air directing device includes members to facilitate flow through the air directing device. For example, as shown in FIGS. 2A and 3, air directing device 126 includes vanes 133. Vanes 133 may facilitate a flow of air through passage 131 of air directing device 126.

Figure 4:
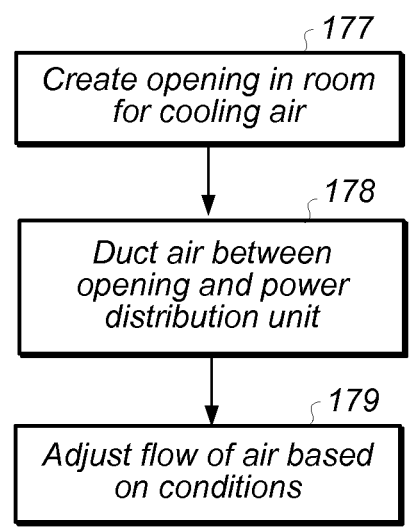
FIG. 4 illustrates one embodiment of cooling power distribution units with air from openings in a room of a data center.

In some embodiments, a method of cooling power distribution units includes removing one or more tiles from a raised floor and ducting pressurized air through the openings into the power distribution units. FIG. 4 illustrates one embodiment of cooling power distribution units with air from openings in a room of a data center. At 177, one or more openings are created in a room. In some embodiments, an opening is created in a raised floor for a room. In one embodiment, openings are created by removing one or more tiles from the raised floor. The openings may establish fluid communication between the space in the room and a sub-floor chamber below the raised floor. The sub-floor chamber may be pressurized, for example, by an air handling system.

At 178, air may be ducted to or from the one or more openings in the room to one or more power distribution units on the floor of the room. In various embodiments, ducting may be accomplished using an air directing device such as described above relative to FIGS. 1, 2A, 2B, and 3. In some embodiments, an air directing device for a power distribution unit is selected from a set of prefabricated air directing device based on the position of power distribution unit relative to an opening for a supply of air (such as a removed tile. Thus, for example, a power distribution unit to be located one foot from a tile opening may be provided with an air directing device of one size, while a power distribution to be located three feet from a tile opening may be provided an air directing device of a different size. In certain embodiments, an adapter plate for an air directing device may be selected based on the position of a power distribution unit relative to a floor opening. In some embodiments, each opening in the room provides air flow to a single power distribution unit. In other embodiments, one opening may provide air for two or more power distribution units. In some embodiments, two or more openings in a floor may provide air for a single power distribution unit.

Although in the embodiment described above, cooling is supplied through an opening in a floor, in various embodiments, cooling air may be supplied through openings in other parts of a room. In various embodiments, for example, air may be supplied through the ceiling of a room or a side wall of a room.

At 179, a flow of air through one or more power distribution units may be adjusted. In certain embodiments, air flow to one or more power distribution units is adjusted, for example, by modulating the position of a damper in an air directing device. Adjustment of air flow may be manual, automatic, or a combination thereof. In some embodiments, a flow of air is adjusted based on conditions in or around a data center or components in the data center. In one embodiment, air flow to a power distribution unit may be controlled based on a temperature in the power distribution unit. In another embodiment, air flow to a power distribution unit is controlled based on ambient temperature outside a data center. The flow of air may be commonly controlled among two or more power distribution units or independently controlled for each power distribution unit.

Figure 5A:
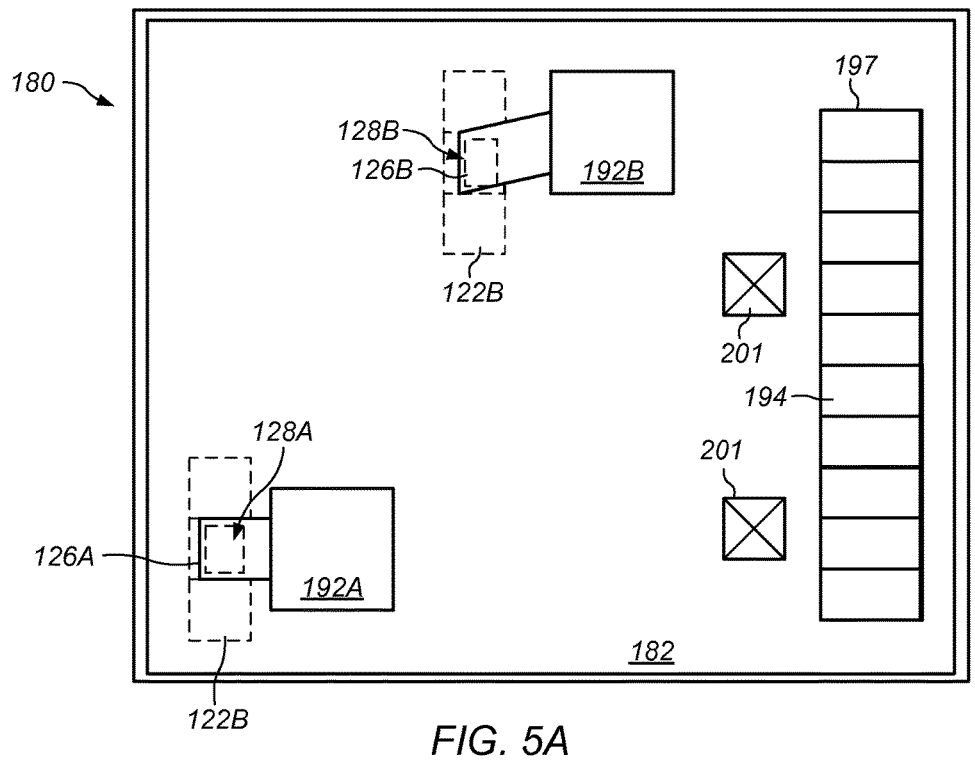
FIG. 5A illustrates a schematic top view illustrating one embodiment of a data center including power distribution units supplied with cooling air using air directing devices.
Figure 5B:
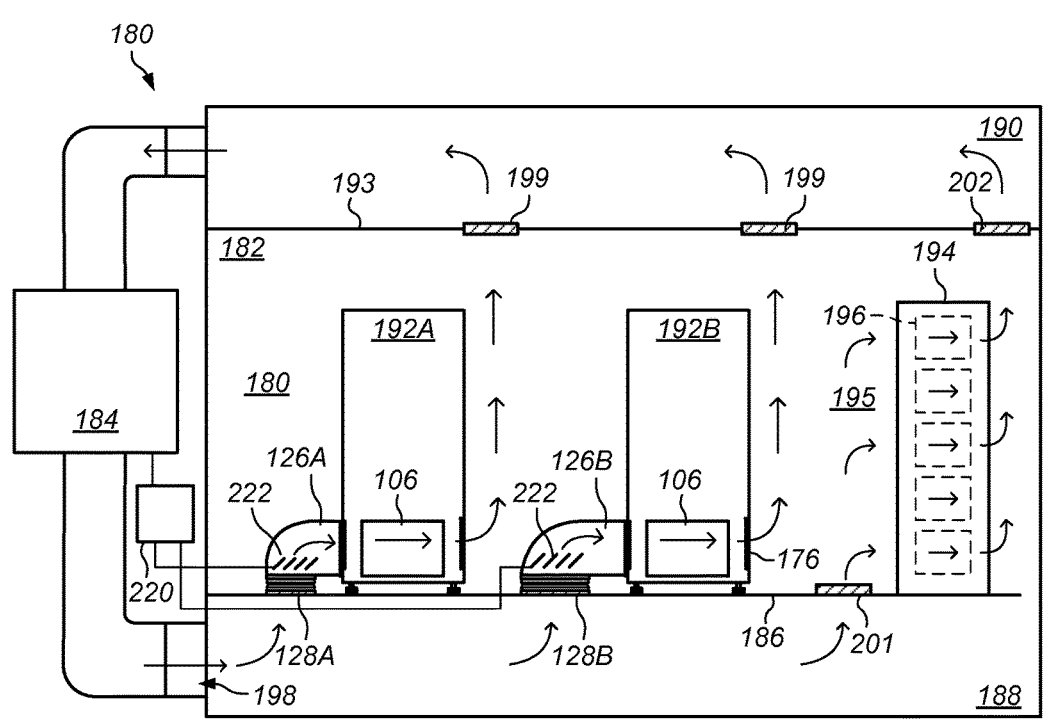
FIG. 5B illustrates a schematic end view of the data center shown in FIG. 5A.

In some embodiments, a data center includes an air handling system that provides cooling air flow to one or power distribution units using air directing devices. FIG. 5A illustrates a schematic top view illustrating one embodiment of a data center including power distribution units supplied with cooling air using air directing devices. FIG. 5B illustrates a schematic end view of the data center shown in FIG. 5A. Data center 180 includes room 182, air handling system 184, raised floor 186, subfloor chamber 188, and plenum 190. Plenum 190 is above ceiling 193 of room 182.

Room 182 includes power distribution unit 192A and power distribution unit 192B, and racks 194 in row 197. Racks 194 include computer systems 196. Subfloor chamber 188 may supply air to power distribution units 192A and 192B and to computer systems 194 in room 182.

To remove heat from power distribution units 192A and 192B, air handling system 184 may be operated to cause air to flow. Air may be forced into sub floor chamber 188 through opening 198. Air in subfloor chamber 188 may be at positive pressure relative to ambient air in room 182. Air from subfloor chamber 165 may pass into air directing devices 126A and 126B through floor openings 128A and 128B in raised floor 186. Air directing devices 126A and 126B may direct air into power distribution units 192A and 192B and across transformers 106. Heated air from power distribution units 192A and 192B may be vented through vents 176 to room 182. Vented air may pass through vents 199 in ceiling 193 and into plenum 190. Air from plenum 190 may be returned to air handling system 184, vented to outside air, or a combination of both.

Air from sub-floor chamber 188 may flow through vents 201 in raised floor 186 and into rack systems 194. Air in rack systems 194 may flow across computer systems 196 and out of rack systems 194. Air exiting rack systems 194 may pass out of room 182 through vents 202 in ceiling 193.

Although in the embodiment illustrated in FIGS. 5A and 5B, only one row of racks is shown, a computer room may include any number of racks and any number of computer systems. In one embodiment, each power distribution unit in a data center provides power for one row of racks. Although in the embodiments shown in FIGS. 5A and 5B, power distribution units are in the same room as the rack systems, in some embodiments, power distribution units are in a different room from the computer systems in a data center.

In some embodiments, the size and shape of an air directing device may be selected based on the location of the power distribution unit relative to one or more openings in the room. As illustrated in FIG. 5B, for example, power distribution unit 192A is at one spacing and position relative to tiles 122A and floor opening 128A, while power distribution unit 192B is at a different distance and position relative to tiles 122B and floor opening 128B. As such, as compared with air directing device 126A selected for power distribution unit 192A, the air directing device 126B for power distribution unit 192B is relatively longer and has an angular shape. In certain embodiments, an air directing device is selected from a set of two or more prefabricated sizes and shapes.

In some embodiments, an air directing device includes one or more air flow control devices. For example, in the embodiment shown in FIGS. 5A and 5B, air directing device 126A and air directing device 126B include dampers 222. The position of dampers 222 may be adjusted to regulate a flow of air through power distribution units 192A and 192B.

The dampers of an air directing device may be controlled automatically, manually, or a combination thereof. In the embodiment illustrated in FIGS. 5A and 5B, data center 180 includes control system 220. Control system 220 may be operable to control the positions of dampers 222. In certain embodiments, a control system includes at least one programmable logic controller. The PLC may receive measurements of conditions (such as temperature, humidity, and/or pressure) in the air directing device or at other locations in a data center. In one embodiment, the PLC receives data from a flow sensor that measures airflow in an air directing device. Based on sensor data, the PLC may open and close dampers in one or more air directing devices, as appropriate for the prevailing operational conditions. Alternatively, the PLC may modulate dampers between fully open and fully closed positions to modulate airflow, as appropriate for the prevailing operational conditions. Damper 222 in air directing device 126A may be separately controlled from, or commonly controlled with, damper 222 in air directing device 126B.

Figure 6:
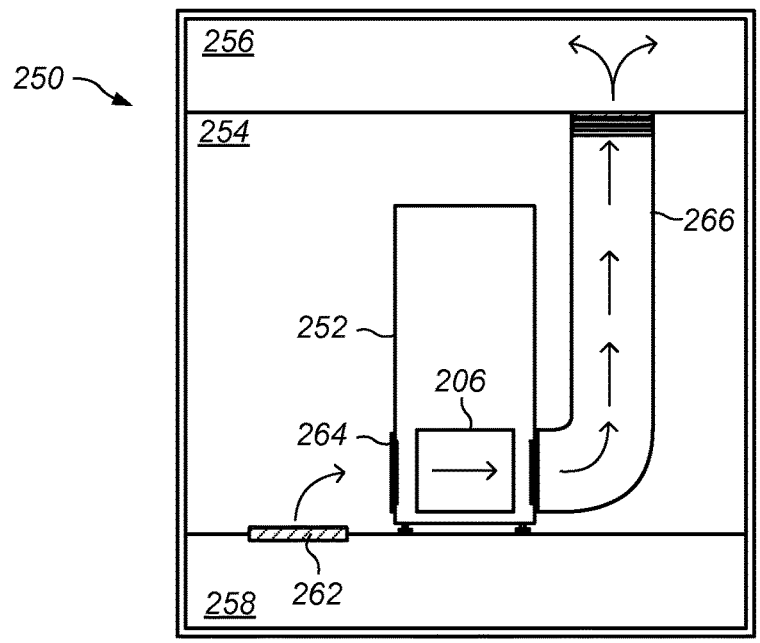
FIG. 6 illustrates one embodiment of a cooling arrangement for a power distribution unit in which air is drawn from the power distribution unit into an air directing device coupled to a ceiling plenum.

In some embodiments, a cooling system for a data center may draw air through a power distribution unit and into an air directing device. FIG. 6 illustrates one embodiment of a cooling arrangement for a power distribution unit in which air is drawn from the power distribution unit into an air directing device coupled to a ceiling plenum. Data center 250 includes power distribution unit 252 in room 254. An air handling system may be operated to produce a negative pressure in plenum 256 relative to the ambient pressure in room 254 and/or positive pressure in sub-floor chamber 258 relative to the ambient pressure in room 254. Air may be introduced from sub-floor chamber 258 into room 254 through floor vent 262 and introduced into power distribution unit 252 through vent 264. Air in power distribution unit 252 may be drawn across transformer 206, out of power distribution unit 252, through air directing device 260, and into ceiling plenum 256.

Figure 7:
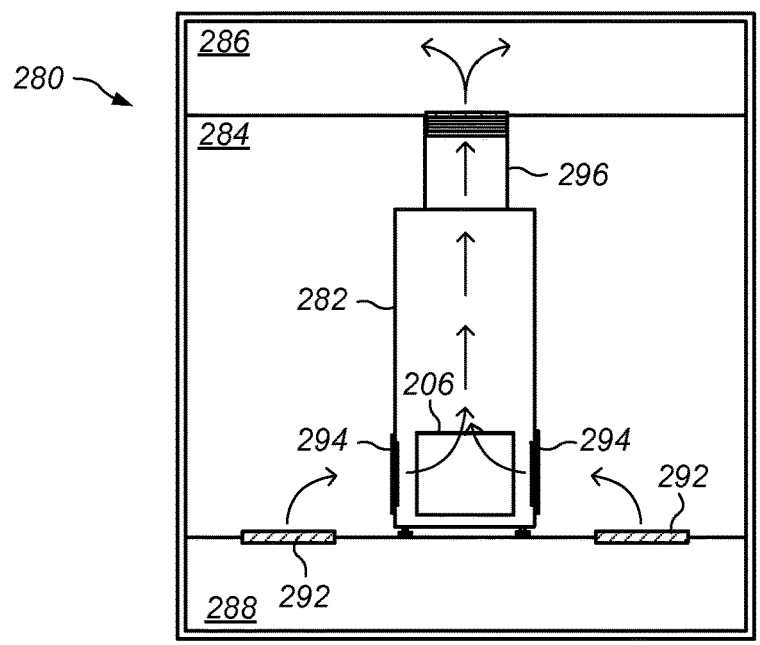
FIG. 7 illustrates one embodiment of a cooling arrangement for a power distribution unit in which air is drawn in through side vents of the power distribution unit and out through the top of the power distribution unit.

FIG. 7 illustrates one embodiment of a cooling arrangement for a power distribution unit in which air is drawn in through side vents of the power distribution unit and out through the top of the power distribution unit. Data center 280 includes power distribution unit 282 in room 284. An air handling system may be operated to produce a negative pressure in plenum 286 relative to the ambient pressure in room 284 and/or positive pressure in sub-floor chamber 288 relative to the ambient pressure in room 284. Air may be introduced from sub-floor chamber 288 into room 284 through floor vents 292 and introduced into power distribution unit 282 through vents 294. Air in power distribution unit 282 may be drawn across transformer 206, out of power distribution unit 252 through the top of power distribution unit 282, through air directing device 290, and into ceiling plenum 286.

Figure 8:
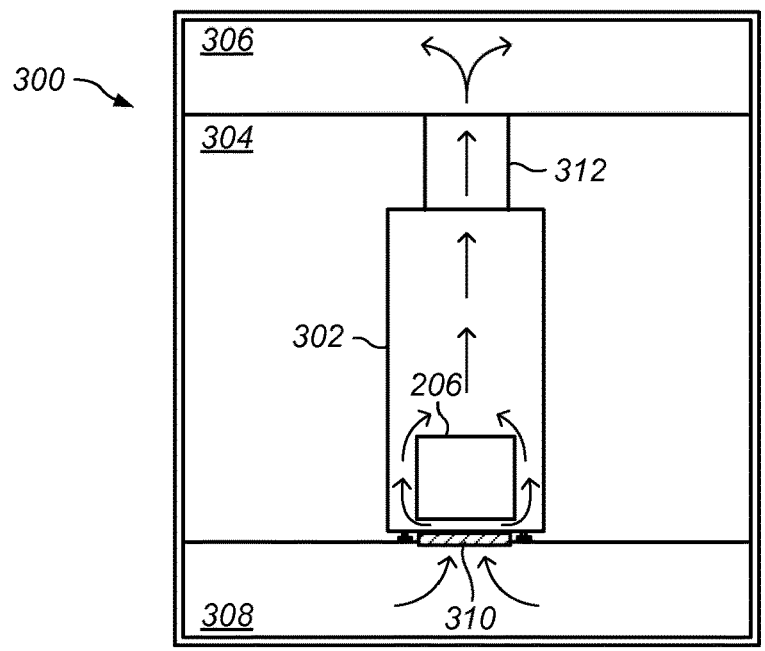
FIG. 8 illustrates one embodiment of a cooling arrangement for a power distribution unit in which air is introduced into the power distribution unit through the bottom of the power distribution unit.

In certain embodiments, air for cooling a power distribution unit may enter or exit the power distribution unit through the bottom of a cabinet for the power distribution unit. FIG. 8 illustrates one embodiment of a cooling arrangement for a power distribution unit in which air is introduced through the bottom of the power distribution unit. Data center 300 includes power distribution unit 302 in room 304. An air handling system may be operated to produce a negative pressure in plenum 306 relative to the ambient pressure in room 304 and/or positive pressure in sub-floor chamber 308 relative to the ambient pressure in room 304. Air may be introduced from sub-floor chamber 308 into room 304 through floor vent 310 and introduced into power distribution unit 302. Air in power distribution unit 302 may be drawn across transformer 206, out of power distribution unit 302 through the top of power distribution unit 302, through air directing device 312, and into ceiling plenum 306.

Figure 9:
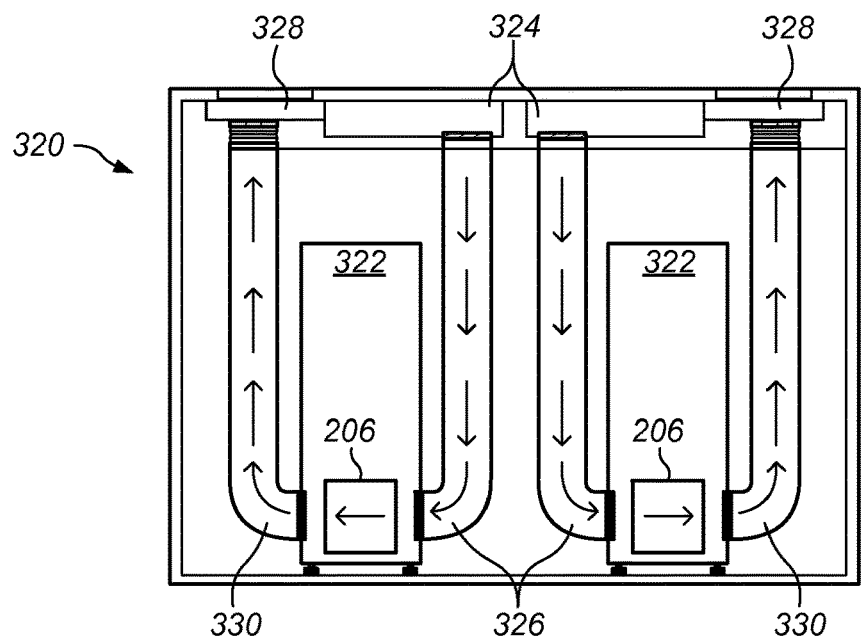
FIG. 9 illustrates one embodiment of a data center in which air is introduced and removed from power distribution units using air directing devices.

In certain embodiments, air directing devices are providing for both supplying air to, and removing air from, a power distribution unit. FIG. 9 illustrates one embodiment of a data center in which air is introduced and removed from power distribution units using air directing devices. Data center 320 includes power distribution units 322. Air is supplied from supply vent 324 to power distribution units 322 by way of air directing devices 326. Air is removed from power distribution unit 322 into return vents 328 by way of air directing devices 330.

In the embodiments described above relative to FIGS. 1, 2A, 2B, 5A, and 5B, 6, 7, 8, and 9, air directing devices were used to provide cooling for power distribution units. Air directing devices may, however, be used in various embodiments to cool any system. For example, air directing devices and cooling arrangements as described above may be used to cool rack-mounted servers.

In the power distribution units illustrated in FIGS. 1, 2A, 2B, 5A, and 5B, the transformer was located in the bottom portion of the power distribution unit. A transformer may, however, be located in any location in a power distribution unit. In certain embodiments, a transformer for a power distribution may be in a separate enclosure from distribution panels for the power distribution unit. A power distribution may have any number of transformers and any number of distribution panels.

In various embodiments having cooling arrangements described above relative to FIGS. 6 through 8, air from a sub-floor chamber may be introduced through an opening creating by removing a tile in a raised floor, such as described above relative to FIGS. 1 and 3.

Although the embodiments above have been described in considerable detail, numerous variations and modifications will become apparent to those skilled in the art once the above disclosure is fully appreciated. It is intended that the following claims be interpreted to embrace all such variations and modifications.

What is claimed is:
1. A cooling system, comprising:
an air handling system comprising one or more sub-floor plenums, at least a first opening in a floor of a room of a data center, and one or more additional openings in the floor of the room of the data center, wherein the air handling system is configured to supply air to the room or remove air from the room through the first opening in the floor of the room or the one or more additional openings in the floor of the room; and
an air directing device comprising a first end and a second end, wherein the first end of the air directing device is configured to couple with the first opening in the floor, and wherein the second end of the air directing device is configured to couple with one or more openings in a bottom portion of an enclosure of a floor power distribution unit in the room, wherein the air directing device is configured to direct an air flow between the first opening in the floor and the floor power distribution unit to cool a transformer mounted within the enclosure of the floor power distribution unit near a bottom portion of the floor power distribution unit;
wherein a surface of the air directing device is configured to physically separate the air flow from the first opening from one or more other air flows from the one or more additional openings, wherein the one or more other air flows provide cooling for a plurality of racks in the room;
wherein the floor power distribution unit is separately mounted on the floor of the room separate from the plurality of racks, wherein electrical loads mounted in one or more of the plurality of racks receive electrical power from the floor power distribution unit, and
wherein:
the one or more air flows from the one or more additional openings in the floor that provide cooling for the plurality of racks and
the air flow between the first opening in the floor and the floor power distribution unit via the air directing device,
are separate air flows.
2. The cooling system of claim 1, wherein the room comprises a raised floor, and wherein the opening in the floor corresponds to an opening in the raised floor for a floor tile.

3. The cooling system of claim 2, wherein the air directing device further comprises an adapter plate configured to adapt an air inlet of the air directing device to the opening in the raised floor, wherein:
the air inlet of the air directing device encloses an area that is smaller than the opening, such that the air inlet, when positioned within the opening in the raised floor, encloses a limited portion of the opening, and
to adapt the air inlet to the opening, the adapter plate is configured to:
couple with inner edges of the opening and outer edges of the air inlet, and
enclose a portion of the opening, bounded by at least the inner edges of the opening, that is not enclosed by the air inlet when the air inlet is positioned within the opening.

4. The cooling system of claim 1, wherein at least one of the one or more sub-floor plenums of the cooling system is a sub-floor chamber under the floor of the room, wherein the air handling system is configured to pressurize the sub-floor chamber relative to air in the floor power distribution unit such that air flows through the floor power distribution unit.

5. The cooling system of claim 1, wherein the air directing device comprises at least one support configured to support the air directing device in a fixed relationship to the floor of the room.

6. The cooling system of claim 1, wherein the air directing device is configured to couple at one or more vents in the floor power distribution unit.

7. The cooling system of claim 1, wherein the air directing device further comprises a sealing portion configured to resiliently couple with the floor power distribution unit.

8. The cooling system of claim 1, wherein the air directing device comprises one or more passages, wherein at least one of the passages is tapered such that a cross section of the one or more passages at the second end is larger than a cross section of the one or more passages at the first end.

9. The cooling system of claim 1, wherein at least a portion of the air directing device is flexible to facilitate coupling of the air directing device with at least one of the floor of the room or the floor power distribution unit.

10. The cooling system of claim 1, wherein the air handling system is configured to push the air flow from the first opening in the floor through the air directing device and into the floor power distribution unit.

11. The cooling system of claim 1, wherein the air handling system is configured to draw air out of the floor power distribution unit and into the air directing device.

12. The cooling system of claim 1, further comprising at least one damper configured to control the air flow through the floor power distribution unit separately from the one or more air flows for the plurality of racks.

13. The cooling system of claim 1, further comprising at least one control system, wherein the at least one control system is configured to control the air flow through the floor power distribution unit separately from the one or more air flows that provide cooling for the plurality of racks.

14. The cooling system of claim 1, wherein the air directing device is configured to redirect at least a portion of the air flow from the first opening in the floor from one direction to at least one other direction.

15. A data center, comprising:
a plurality of racks, wherein each rack comprises one or more computer systems mounted in the rack;
one or more floor power distribution units positioned in a room of the data center, wherein:
the one or more floor power distribution units are separately mounted on a floor of the data center separate from the plurality of racks,
at least one of the one or more floor power distribution units comprises an enclosure positioned in the room, and
the one or more floor power distribution units are configured to distribute electrical power to respective ones of the computer systems mounted in two or more of the plurality of racks;
one or more air handling systems configured to supply or remove air through at least a first opening in a floor of the room and one or more additional openings in the floor of the room; and
one or more air directing devices, at least one of the air directing devices comprising a first end and a second end, wherein the first end of the at least one air directing device is configured to couple with the first opening in the floor and the second end of the at least one air directing device is configured to couple with at least one of the floor power distribution units at one or more openings in a bottom portion of the enclosure for the at least one floor power distribution unit, wherein the air directing device is configured to direct an air flow between the first opening in the floor and the one or more openings in the bottom portion of enclosure for the at least one floor power distribution unit; and
wherein a surface of the at least one air directing device is configured to physically separate the air flow from the first opening in the floor from one or more other air flows from the one or more additional openings in the floor, wherein the one or more other air flows provide cooing for the computer systems mounted in the plurality of racks.

16. The data center of claim 15, wherein the enclosure for the at least one of the floor power distribution units comprises two or more openings, wherein at least one of the openings is configured to receive air from the at least one air directing device into the enclosure, wherein another one of the openings in the enclosure is configured to discharge air from the enclosure.

17. The data center of claim 16, wherein the openings in the enclosure that are configured to receive air from the air directing device into the enclosure, via the openings, are perforations.

18. The data center of claim 15, wherein at least one of the floor power distribution units comprises at least one transformer, wherein at least a portion of the air flow from at least one of the air directing devices flows across the at least one transformer.

19. The data center of claim 15, wherein the one or more floor power distribution units in the room comprise two or more floor power distribution units, wherein the one or more air directing devices are configured to supply air to at least two of the floor power distribution units.

20. The data center of claim 15, wherein the one or more floor power distribution units in the room comprise two or more floor power distribution units, wherein one of the air directing devices is configured to supply air to, or remove air from, at least two of the floor power distribution units.

21. The data center of claim 15, wherein the room comprises a raised floor, wherein the opening corresponds to an open space for a floor tile in the raised floor.

22. The data center of claim 15, wherein the data center comprises a sub-floor chamber under a floor of the room, wherein at least one of the one or more air handling systems is configured to pressurize the sub-floor chamber relative to air in at least one of the floor power distribution units such that air flows through the at least one floor power distribution unit.

23. The data center of claim 15, wherein the room comprises a ceiling comprising at least one opening in the ceiling, wherein the air handling system is configured to move air out of at least one of the floor power distribution units, into at least one of the air directing devices, and through the opening in the ceiling.

24. A method for cooling a room of a data center, comprising:
   separately mounting a floor power distribution unit on a floor of the room separate from a plurality of racks comprising electrical loads that receive power from the floor power distribution unit
   creating an opening in the floor of the room;
   coupling an air directing device between the opening in the floor and one or more openings in a bottom portion of an enclosure for the floor power distribution unit;
   flowing air between the opening in the floor and the floor power distribution unit via the air directing device; and
   flowing air from one or more other openings in the floor of the room to provide cooling for the plurality of electrical loads mounted in the plurality of racks that receive power from the floor power distribution unit,
   wherein a surface of the air directing device physically separates the air flowing via the air directing device from one or more other air flows from the one or more other openings in the floor of the room.

25. The method of claim 24, wherein creating the opening in the room comprises removing a tile from a raised floor.

26. The method of claim 24, wherein coupling the air directing device between the opening in the floor of the data center and the one or more openings in the bottom portion of the enclosure of the floor power distribution unit comprises selecting, based on a position of the floor power distribution unit relative to the opening in the room, the air directing device from a set of at least two prefabricated air directing devices having two or more different sizes or shapes.

27. The method of claim 24, further comprising adjusting air flow to the floor power distribution unit based on at least one measured characteristic of air, wherein the air flow to the power distribution unit is adjusted separate from the one or more air flows from the one or more other openings in the floor that provide cooling for the plurality of electrical loads mounted in the plurality of racks that receive power from the floor power distribution unit.

* * * * *